US007210516B2

(12) United States Patent
Wakita et al.

(10) Patent No.: US 7,210,516 B2
(45) Date of Patent: May 1, 2007

(54) CASTING APPARATUS AND METHOD THEREFOR

(75) Inventors: Saburou Wakita, Noda (JP); Junichi Sasaki, Kawasaki (JP); Yuuji Ishiwari, Saitama (JP); Kouji Tsuzukihashi, Akita (JP)

(73) Assignees: Mitsubishi Materials Corporation, Tokyo (JP); Japan Electric Metals Corporation, Limited, Akita-shi (JP)

( * ) Notice: Subject to any disclaimer, the term of this patent is extended or adjusted under 35 U.S.C. 154(b) by 0 days.

(21) Appl. No.: 10/625,657

(22) Filed: Jul. 24, 2003

(65) Prior Publication Data
US 2004/0050522 A1 Mar. 18, 2004

(30) Foreign Application Priority Data
Jul. 25, 2002 (JP) ............................. 2002-216874

(51) Int. Cl.
*B22D 7/06* (2006.01)
(52) U.S. Cl. ...................................... 164/259; 164/66.1
(58) Field of Classification Search ............... 164/66.1, 164/75, 259
See application file for complete search history.

(56) References Cited

U.S. PATENT DOCUMENTS

| 4,140,170 A | * | 2/1979 | Baum | ......................... 164/493 |
| 4,726,414 A | * | 2/1988 | Merrien | ....................... 164/119 |
| 5,042,561 A | * | 8/1991 | Chandley | ...................... 164/63 |
| 5,211,744 A | * | 5/1993 | Areaux et al. | ................ 75/594 |
| 5,961,944 A | * | 10/1999 | Aratani et al. | .............. 423/348 |
| 6,299,682 B1 | * | 10/2001 | Wakita et al. | ................. 117/11 |
| 6,378,835 B1 | | 4/2002 | Wakita et al. | |
| 6,383,285 B1 | * | 5/2002 | Wakita et al. | ................. 117/11 |
| 6,547,849 B2 | * | 4/2003 | Gross et al. | ................... 75/548 |

FOREIGN PATENT DOCUMENTS

| EP | 1 048 758 | 11/2000 |
| EP | 1 072 696 | 1/2001 |
| JP | 2000-158096 | 6/2000 |

* cited by examiner

*Primary Examiner*—Len Tran
(74) *Attorney, Agent, or Firm*—Oblon, Spivak, McClelland, Maier & Neustadt, P.C.

(57) ABSTRACT

A casting apparatus including a die that contains a molten metal that is poured via an opening section disposed above the die. The casting apparatus also includes a heater disposed above the die, and a gas supplying structure for supplying an inter gas to a surface of the molten metal. The casting apparatus further includes a lid disposed between the surface of the molten metal and the heater, and a lid moving structure for moving the lid to the die relatively so as to control the opening amount of the opening section above the die.

17 Claims, 6 Drawing Sheets

CASTING APPARATUS AND METHOD THEREFOR

BACKGROUND OF THE INVENTION

1. Field of the Invention

The present invention relates to a casting apparatus for manufacturing a metal such as a polycrystalline silicon ingot and casting method therefore.

2. Description of Related Art

It is usual to blow an inert gas so as to surround a die by an inert atmosphere for casting a raw material such as silicon (Si) or a high-melting-point-metal which tends to be oxidized when cast in a die under an ordinary atmosphere condition. In particular, it is common to blow an argon (Ar) gas to a surface of a molten silicon when a polycrystalline silicon ingot which is used for a solar cell and the like is casted.

Thus, by supplying the Ar gas, a silicon oxide (SiO) gas which is generated in the molten metal is removed and a carbon monoxide (CO) gas which is generated when the SiO gas reacts with carbon (C) which is contained in the furnace is prevented from being contained in a molten metal. In particular, it is commonly known that quite an amount of a carbon is contained in the ingot when the CO gas is contained in the molten metal; thus, the product is affected unfavorably.

In a document such as a Japanese Unexamined Patent Application, First Publication No. 2000-158096, it is disclosed that a section for supplying an Ar gas is disposed and a lid is disposed above the die so as to prevent a carbon from being contained in the ingot by restricting a CO gas in the molten metal conventionally.

However, the above conventional casting method has following problems. That is, there is a problem in that a raw raw material which is used in the casting operation is limited when the raw material is poured in the die if a lid is disposed above the die. Also, there is a concern that a molten silicon on the surface of the raw material melted while the raw material is melted is splashed and adheres to the lid; thus, an impurity is contained in the molten silicon. Furthermore, a push-out effect of an Ar gas becomes reduced when Ar gas is reduced so as to avoid a splash of molten metal which occurs when the molten metal is nearly solidified and little molten metal remains in the die. In contrast, there is a concern that the lid moves from a predetermined position because of a pressure of the gas when a greater amount of gas is blown.

SUMMARY OF THE INVENTION

The present invention was made inconsideration of the above problems. An object of the present invention is to provide a casting apparatus which can supply a sufficient amount of material while preventing impurities from being contained in the die and a method therefor.

The present invention is realized according to following structure. That is, a casting apparatus of the present invention is characterized in comprising a die which has an opening amount above the die so as to pour a molten metal therefrom, a heater which is disposed above the die, a gas supplying section which supplies an inert gas to a surface of the molten metal, and a lid which is disposed between the surface of the molten liquid and the heater, and a lid moving structure which moves the lid relatively to the die and controls an opening amount of the lid above the die.

The casting apparatus is provided with a lid moving structure which moves the lid relatively to the die and controls an opening amount of the lid above the die. Therefore, it is possible to supply a sufficient amount of raw material by moving the lid above the die sufficiently. Also, it is possible to control the opening amount by moving the lid according to necessity in other casting operations; thus, it is possible to deal with various casting conditions under a favorable casting condition.

Also, in the casting apparatus according to the present invention, a method is employed by which the lid moving structure adjusts the opening amount according to a flow amount of the inert gas.

Also, it is characterized in that a casting method according to the present invention comprises the steps for pouring a molten metal from an opening amount which is disposed above the die, supplying an inert gas to a surface of a molten metal, controlling a heating operation by a heater by adjusting a disposition of the lid which is disposed above a surface of the molten metal so as to solidify the molten metal. In this aspect of the present invention, it is characterized in that the opening amount of the lid above the die is controlled by moving the lid relatively to the die according to a flow amount of the inert gas.

That is, according to a casting apparatus and a method therefor, an opening amount is adjusted according to a flow amount of an inert gas; therefore, it is possible to control a flowing speed of a gas which is exhausted from between the die and the lid at a predetermined speed, for example, by adjusting the opening amount such that the wider opening amount is, the more inert gas is supplied on a surface of the molten metal. Thus, it is possible to maintain an effect for preventing impurities contamination in the molten metal regardless of the flow amount of the inert gas.

Also, in the casting apparatus according to the present invention, it is characterized in that the lid moving structure has a section for moving the lid vertically, horizontally, or rotatively to the die. That is, the lid moving structure of the present invention has a section for moving the lid vertically, horizontally, or rotatively to the die. Therefore, it is possible to control the opening amount by a simple structure and movement.

Also, in the casting apparatus according to the present invention, it is preferable that the molten metal is a molten silicon, and at least a bottom surface of the lid is coated by an non-reactive material with a silicon oxide gas or a silicide. That is, in the present casting apparatus, the molten metal is a molten silicon, and at least a bottom surface of the lid is coated by an non-reactive material with a silicon oxide gas or a silicide like a silicon carbide (SiC); therefore, it is possible to prevent the impurities contaminations from the bottom surface of the lid comparing with that the bottom surface of the lid is made of a carbon when a polycrystalline silicon carbide by solidifying the molten metal is manufactured. It is preferable if at least the bottom surface of the lid is made of an non-reactive material with a silicon oxide gas or a silicide. More importantly, it is acceptable if an overall lid is formed by an non-reactive material with a silicon oxide gas or a silicide.

According to the present invention, it is possible to realize following effects. That is, the casting apparatus is provided with a lid moving structure which moves the lid relatively to the die and controls an opening amount of the lid above the die. Therefore, it is possible to supply a sufficient amount of raw material by moving the lid above the die sufficiently and controlling the opening amount. Also, it is possible to control the opening amount desirably; thus, it is possible to deal with various casting conditions under a favorable casting condition. Therefore, it is possible to increase a production amount of an ingot per one casting operation and prevent the impurities contaminations in the molten metal effectively. Therefore, it is possible to obtain a high quality ingot efficiently.

Also, according to the casting apparatus and a method therefor, the opening amount is controlled according to a flow amount of the inert gas. Therefore, it is possible to control a flowing speed of gas at a predetermined speed. Also, it is possible to maintain an effect for preventing an impurities contamination in the molten metal regardless of the flow amount of the inert gas.

DETAILED DESCRIPTION OF THE INVENTION

A first embodiment of the casting apparatus and a method therefor according to the present invention are explained as follows with reference to FIGS. 1 to 4.

Figure 1:
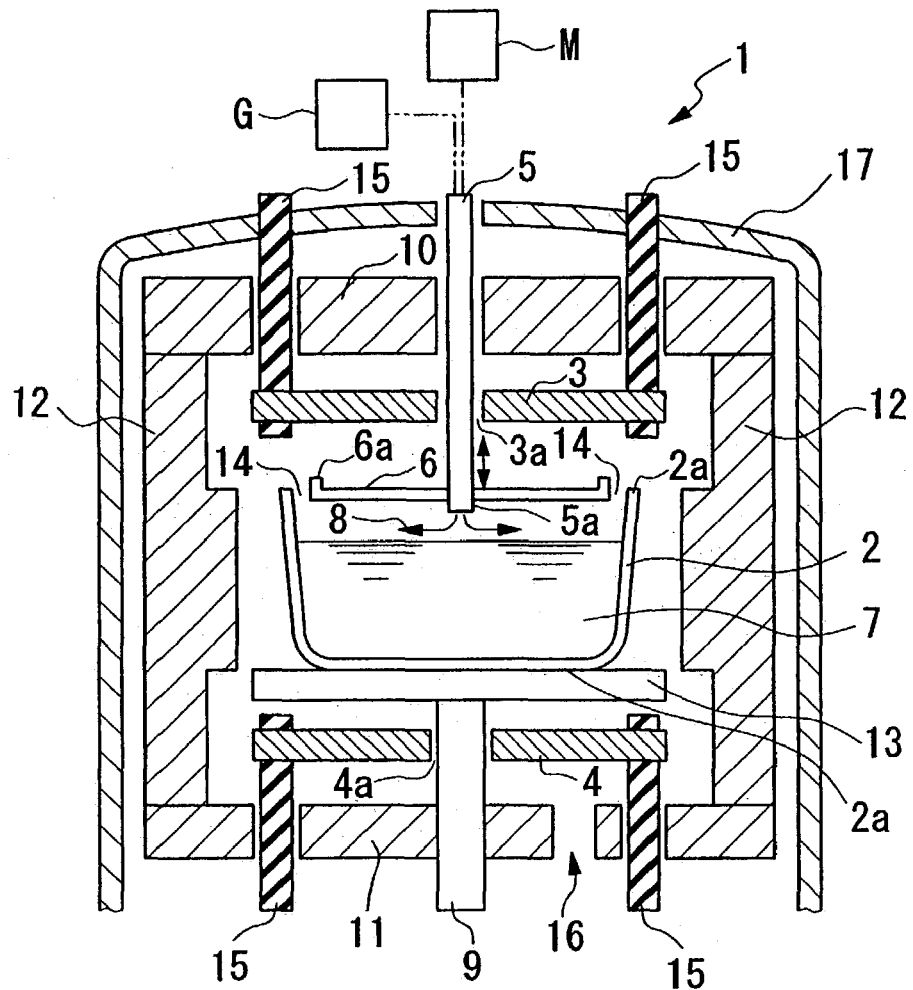
FIG. 1 is a cross section of a casting apparatus in a first embodiment of the casting apparatus and a method therefor according to the present invention.

A casting apparatus 1 according to the present embodiment produces a polycrystalline silicon ingot which used for a solar cell. As shown in FIG. 1, the casting apparatus 1 comprises a die 2 which has an opening section through which a molten metal 7 is poured, an upper heater 3 which is disposed above the die 2, a lower heater 4 which is disposed beneath the die 2, a gas tube 5 which supplies an inert gas 8 to a surface of the molten metal 7, and a lid 6 which is between the surface of the molten metal 7 and the upper heater 3. These members are surrounded by a ceiling section 10, a bottom section 11, and a side wall section 12 which are made of a thermal insulating material. Also, these members are insulated from an outer atmosphere by a chamber 17. Furthermore, the casting apparatus 1 is provided with a lid moving structure M for controlling the opening amount above the die 2 by moving the lid 6 relatively to the die 2.

Figure 2:
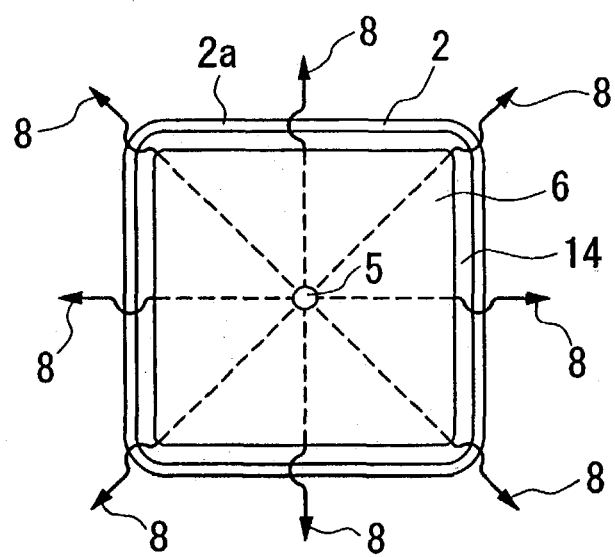
FIG. 2 is a plan view which is viewed from a near side to the die in a first embodiment of the casting apparatus and a method therefor according to the present invention.

The die 2 is formed so as to have a bottom and a cylindrical structure. As shown in FIG. 2, the die 2 is formed in, for example, an approximate square shape when viewed in a plan view. Also, an upper edge section 2a having a rectangular plan view is formed in the opening amount. A molten metal 7 such as a molten silicon is contained in the die 2.

The upper heater 3 and the lower heater 4 are supported by an electrode bar 15. Also, a cooling plate 13 is disposed on an upper end of a supporting section 9 which is disposed through a through hole 4a. Also, a die 2 is mounted on an upper surface of the cooling plate 13.

A gas tube 5 which is made of molybdenum or carbon is supported so as to be freely moved vertically such that the gas tube 5 is disposed through a chamber 17. Also, the gas tube 5 is disposed so as to extend from the chamber 17 downwardly. Also, the gas tube 5 is inserted in a through hole 3a which is formed near a center of the upper heater 3. The gas tube 5 is connected to a gas supplying section G which supplies the inert gas 8 such as Ar gas. By doing this, the inert gas 8 which is supplied from the gas supplying section G is blown on a surface of the molten metal 7. That is, the gas tube 5 and the gas supplying section G forms a gas supplying structure. The gas supplying section G has a structure for controlling a flow amount of the inert gas 8 in each process in the casting method.

A lid 6 which is made of a silicon carbide (SiC) is fixed near a lower edge section 5a of the gas tube 5 so as to cover the opening amount of the die 2. The lid 6 is disposed so as to be separated from a surface of the molten metal 7. Here, the lid 6 is made of a carbon; therefore, it is possible to prevent the impurities contamination from a bottom surface of the lid 6 more effectively when a polycrystalline silicon ingot is obtained by solidifying the molten metal 7 comparing with that the lid 6 is made of a carbon.

Also, a lid moving structure M is made by, for example, a motor and the like. The lid moving structure M is connected to an upper section of the gas tube 5 so as to move the lid 6 vertically via the gas tube 5. The lid moving structure M controls the height position of the lid 6.

The above lid 6 is formed in an approximately square plate when viewed in plan view so as to correspond to a shape of the opening section of the die 2 as shown in FIG. 2. Also, a cross section of an edge section 6a of the lid 6 is formed in an L-shape. Such an L-shape section is disposed upwardly. The lid 6 is formed so as to be slightly smaller than an area of the opening section on the die 2. A lowest position which is set by the lid moving structure M is set to be approximately the same height as that of the upper end section 2a of the die 2. Consequently, an interval 14 is formed along an outer periphery of the lid 6 between the lid 6 and the upper end section 2a.

The lid moving structure M has a structure for moving the lid 6 vertically relatively to the die 2 according to a flow amount of the inert gas 8 so as to control the opening amount which is disposed on an upper part of the die 2. More specifically, the lid moving structure M controls the opening amount such that the flowing speed of the inert gas 8 which flow from between the die 2 and the lid 6 becomes constant. That is, the opening amount in the interval 14 is set to be large when the greater amount of the gas flows. Also, the opening amount in the interval is set to be small when smaller amount of the gas flows. Therefore, a following relationship is effective as far as the gas flowing speed is concerned.

Flow amount of the gas/area of the opening amount in the interval= gas flowing speed which is exhausted from the interval (constant)

Figure 3A:
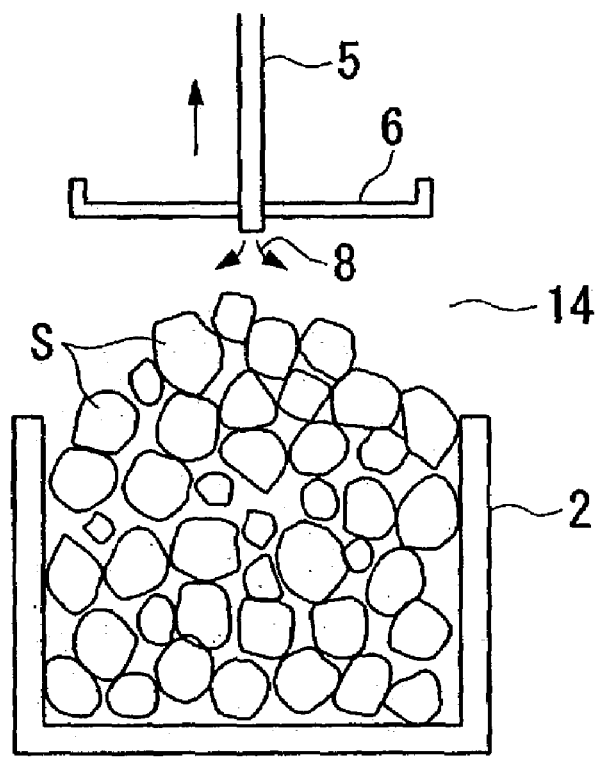
FIGS. 3A and 3B are cross sections for explaining the position of the lid when a raw material is poured in the die and the raw material is molten in a first embodiment of the casting apparatus and a method therefor according to the present invention.
Figure 3B:
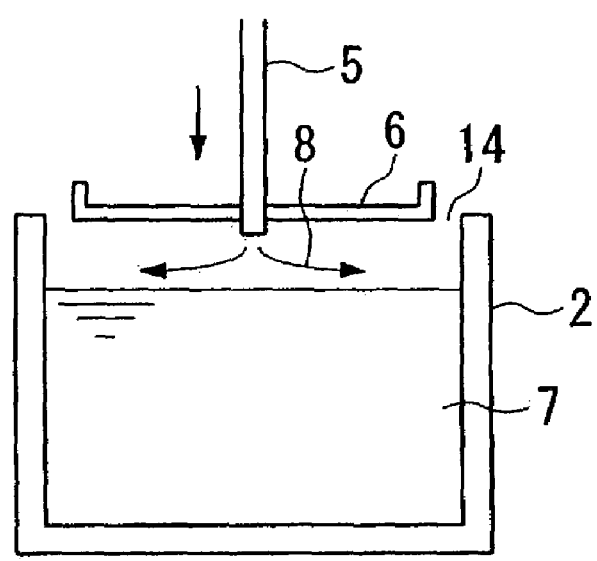
Figure 4:
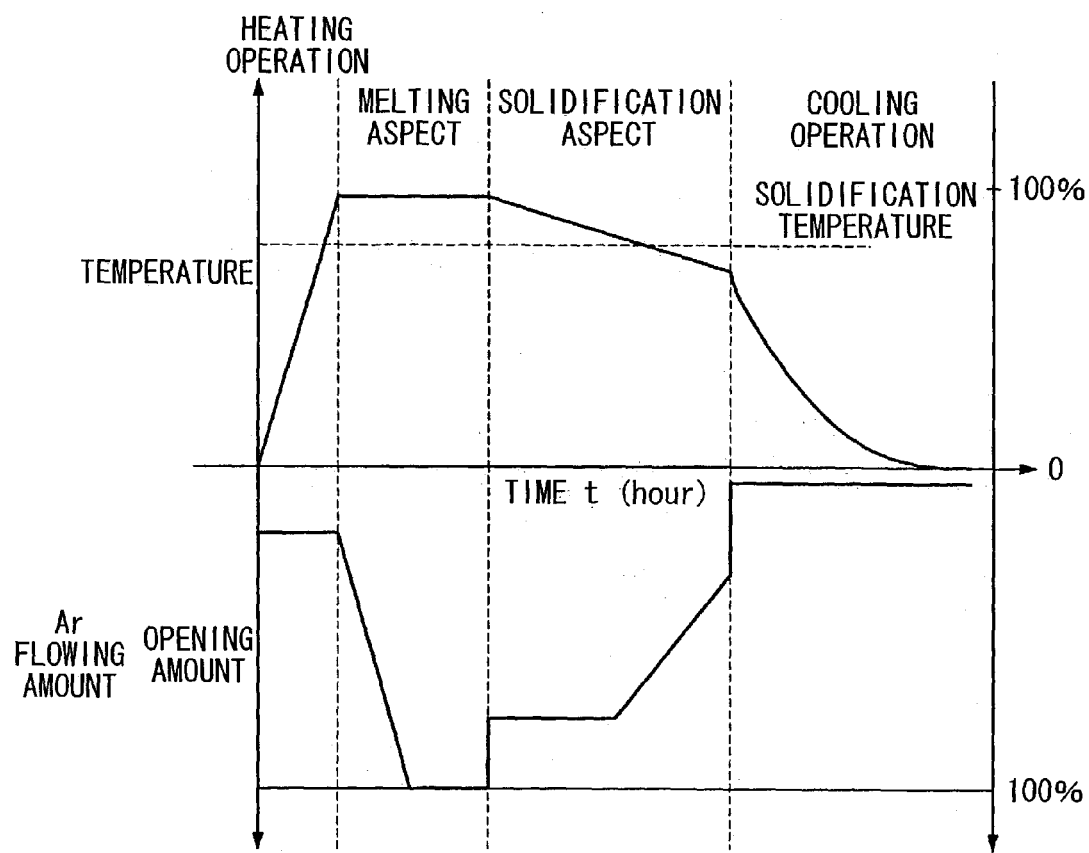
FIG. 4 is a graph for showing factors such as a die temperature, a flow amount of Ar, and opening amount in each manufacturing process in the casting operation in a first embodiment of the casting apparatus and a method therefor according to the present invention.

Next, a method for casing a polycrystalline silicon ingot by the casting apparatus 1 according to the present invention is explained with reference to FIGS. 3A to 4.

First, a raw material S such as Si is filled in the die 2. As shown in FIG. 3A, the position of the lid 6 is disposed at a highest position by the lid moving structure M such that the lid 6 does not contact the upper heater 3. By doing this, it is possible to pour greater amount of the raw material S in the die 2 comparing with that the lid 6 is disposed at a lowest position.

Next, the upper heater 3 and the lower heater 4 heat the raw material S which is filled in the die 2 so as to melt the raw material S. Simultaneously, the inert gas 8 is supplied from an approximate center of the lid 6 to a surface of the molten metal via the gas tube G of the gas supplying section G. The inert gas 8 flows radially along the bottom surface of the lid 6. The inert gas 8 is exhausted from the interval 14. As shown in FIG. 4, the inert gas 8 flows from the gas supplying section G relatively slightly. Also, as shown in FIG. 3B, the lid 6 is disposed at slightly higher position than the lowest position according to the gas flow amount by the lid moving structure M. By doing this, it is possible to restrict a contamination which is generated in an initial phase of the heating operation and a splashing of the raw material S. In FIG. 4, an upper graph indicates a heater control pattern which shows a temperature in the die 2. Also, a lower graph indicates a flow amount of the inert gas (Ar gas) and an opening amount in the opening amount (opening amount in the interval 14).

When the temperature reaches at a predetermined temperature by the both heaters, the die is heated at the temperature for a certain period. Here, the flow amount of the inert gas 8 from the gas supplying section G increases gradually. The flow amount of the inert gas 8 is set at a predetermined flowing speed after the flow amount of the inert gas reaches at a predetermined flow amount. The position of the lid 6 is moved by the lid moving structure M upwardly according to the increase in the flow amount of the inert gas 8. The opening amount of the interval 14 between the lid 6 and the die 2 is gradually increased until the opening amount of the interval 14 reaches a predetermined opening amount. After the opening amount in the interval 14 reaches the predetermined opening amount, the interval 14 is maintained at a constant opening amount.

Next, the raw material S is melted so as to be a molten metal 7 completely. After that, the lower heater 4 stops heating. The heat in the die 2 is removed from a lower portion of the die 2 by the cooling plate 13 while supplying the inert gas 8 until the temperature in the die 2 becomes a solidification temperature or lower. Accordingly, the molten metal 7 which is contained in the die 2 is solidified gradually such that a bottom portion of the molten metal 7 is solidified first. Here, the molten metal 7 is solidified while being oriented in a vertical direction; thus, a polycrystalline silicon ingot which has a unidirectional organization is generated. Also, the flow amount of the inert gas 8 in a first half period of the solidification which is supplied from the gas supplying section G is set to be a constant amount which is lower than the flow amount in a melting period for a purpose of stable crystal grow. The flow amount of the inert gas 8 in a second half period of the solidification which is supplied from the gas supplying section G is decreased gradually. Also, the position of the lid 6 descends by the lid moving structure M according to the flow amount such that the flowing speed of the inert gas 8 which is exhausted from the interval 14 becomes constant. By doing this, it is possible to prevent the molten metal 7 from splashing in an approximate end of the solidification.

Finally, after the molten metal 7 is solidified completely, the die 2 is cooled to a temperature at which it is possible to take out the die 2 safely. Here, the flow amount of the inert gas 8 is set at a slightest amount. Also, the lid 6 is descended at the lowest position such that an area in an opening section in the interval 14 becomes the smallest. Consequently, the sufficiently cooled die 2 is taken out; thus, it is possible to obtain a polycrystalline silicon ingot which has a unidirectional organization.

According to the present embodiment, a lid moving structure M for moving the lid 6 to the die 2 relatively so as to control the opening amount which is disposed above the die 2 is provided. Thus, it is possible to fill the raw material S sufficiently by moving the lid 6 so as to set the opening amount largely which is disposed above the die 2. Also, the lid 6 is moved according to various casting condition, particularly such as a flow amount of the inert gas 8 so as to control the opening amount; thus, it is possible to control the flowing speed of the gas at a predetermined speed. Also, it is possible to maintain an effect for preventing an impurities contamination in the molten metal regardless of the flow amount of the inert gas 8.

Here, the height of the ingot which is supposed to be manufactured is approximately 230 mm according to a conventional method in which a fixed lid is used. In contrast, it is possible to manufacture an ingot which has 300 mm height according to the present embodiment in which the same die is used as that in the conventional method. Also, a density of carbon in the ingot is $5 \times 10^{17}/cm^3$ according to the conventional method in which a fixed lid is used. In contrast, it is possible to reduce a density of carbon in the ingot at a lower density such as $5 \times 10^{16}/cm^3$ according the present embodiment.

Next, a second embodiment of the present invention is explained with reference to FIG. 5

Figure 5:
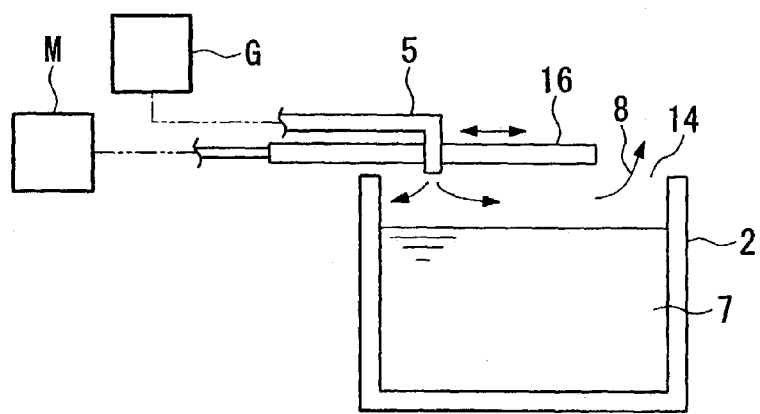
FIG. 5 is a cross section for showing an important part of the casting apparatus in a second embodiment of the casting apparatus and a method therefor according to the present invention.

The second embodiment is different from the first embodiment in that the lid moving structure M moves a lid 16 horizontally so as to control the opening amount of the interval 14 as shown in FIG. 5 according to the second embodiment in contrast to the first embodiment in which the lid moving structure M can move the lid 6 vertically. That is, according to the present embodiment, the lid moving structure M moves the lid 16 to a left-hand direction in the drawing so as to enlarge the interval 14. Also, the lid 16 is moved a right-hand direction in the drawing so as to narrow the interval 14.

Next, a third embodiment of the present invention is explained with reference to FIGS. 6A and 6B.

Figure 6A:
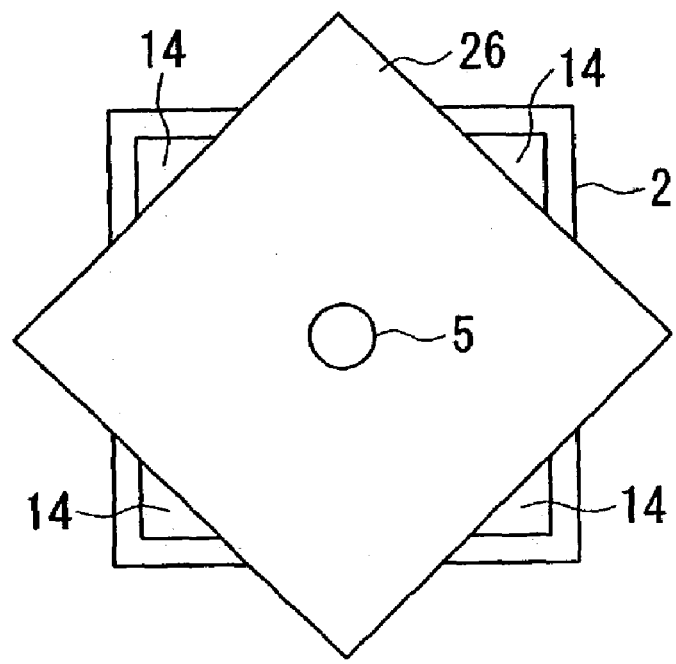
FIGS. 6A and 6B are plan views which are viewed from a near side to the die in a third embodiment of the casting apparatus and a method therefor according to the present invention.
Figure 6B:
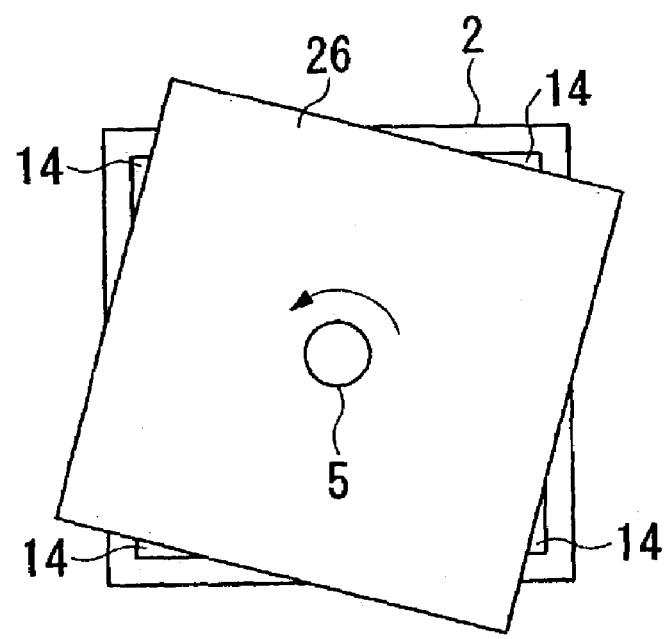

The third embodiment is different from the second embodiment in that the lid moving structure M moves a lid 26 rotatively around the gas tube 5 so as to control the opening amount of the interval 14 to the die 2 as shown in FIGS. 6A and 6B according to the third embodiment in contrast to the second embodiment in which the lid moving structure M moves the lid 16 horizontally. That is, according to the present embodiment, the opening amount in the interval 14 becomes the largest if the lid 26 is rotated form a position in which the plan view of the lid 26 coincides to the plan view of the die 2 to a position in which the lid 26 is rotated by 90° from the previous position as shown in FIG.

6A. In contrast, as shown in FIG. 6B, the opening amount of the interval 14 becomes narrower gradually according to the rotating amount of the lid 26 when the lid 26 is rotated further.

Figure 7:
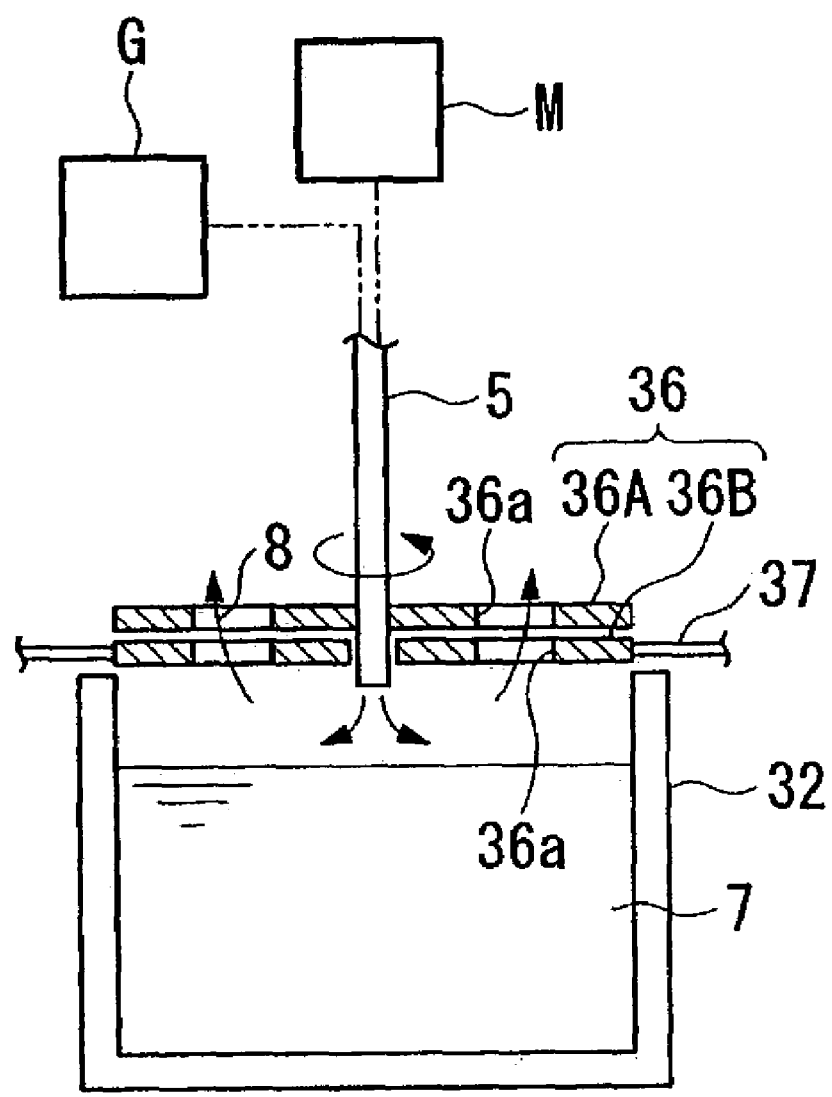
FIG. 7 is a cross section for showing an important part of the casting apparatus in a fourth embodiment of the casting apparatus and a method therefor according to the present invention.
Figure 8A:
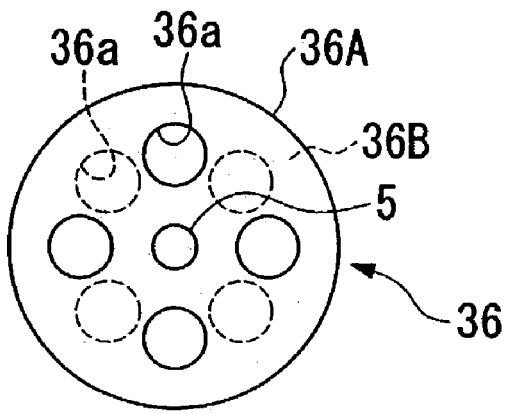
FIGS. 8A to 8C are plan views which are viewed from a near side to the die in the fourth embodiment of the casting apparatus and a method therefor according to the present invention.
Figure 8B:
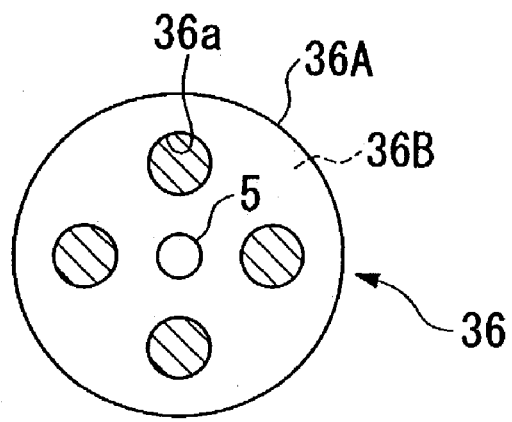
Figure 8C:
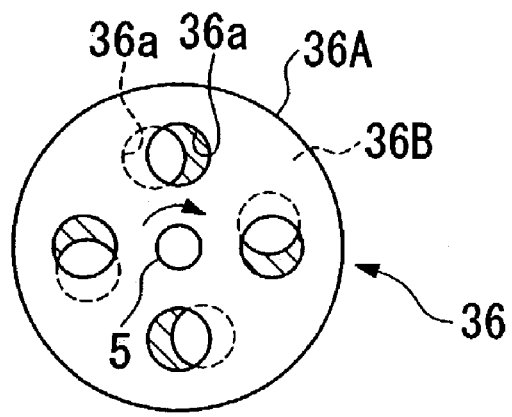

Next, a fourth embodiment of the present invention is explained with reference to FIGS. 7 to 8C The fourth embodiment is different from the third embodiment in that a lid 36 which has a double-wall structure formed by a movable upper plate 36A and a fixed lower plate 36B is disposed according to the fourth embodiment as shown in FIGS. 7 to 8C so as to control the opening amount of the opening amount above a die 32 by rotating not the fixed lower plate 36B but only the movable upper plate 36A which has a plurality of ventilating holes 36a in contrast to the third embodiment in which the lid 16 having one-piece structure is rotated so as to control the opening amount of the interval 14. Here, in the present embodiment, a die 32 has a circular horizontal cross section.

That is, according to the present embodiment, as shown in FIG. 7, the fixed lower plate 36B is supported on the die 32 by a supporting member 37 separately from the gas tube 5. Also, the movable upper plate 36a is fixed to the gas tube 5 so as to be rotated together with the gas tube 5 by the lid moving structure M. For example, as shown in FIG. 8A, the movable upper plate 36A is rotated by the lid moving structure M so as to shift the ventilating holes 36a on the movable upper plate 36A from the ventilating holes 36a on the fixed lower plate 36B. Thus, if the ventilating holes 36a are closed, the opening amount of the opening section above the die 32 becomes minimum. Also, as shown in FIGS. 7 and 8B, the movable upper plate 36A is rotated by the lid moving structure M so as to completely coincide the ventilating holes 36a on the movable upper plate 36A and the ventilating holes 36a on the fixed lower plate 36B. Thus, the opening amount of the opening section above the die 32 becomes maximum. Also, as shown in FIG. 8C, the movable upper plate 36A is rotated by the lid moving structure M such that approximately a half portion of the ventilating holes 36a on the movable upper plate 36A overlap the ventilating holes 36a on the fixed lower plate 36B, the opening amount of the opening section above the die 32 becomes an intermediate approximately between the above two cases.

By doing this, it is possible to control the opening amount of the opening section above the die 32 desirably by the lid moving structure M according to the second to fourth embodiments. Therefore, it is possible to realize a desirable opening amount in each process in the casting operation; thus, it is possible to perform a desirable casting operation.

Here, it is should be understood that the scope of the present invention is not limited to the above embodiments and that various changes and modifications may be made thereto without departing from the spirit and scope of the invention as defined in the appended claims.

For example, according to the first embodiment, the lid and the gas tube are fixed together and moved together vertically. More importantly, it is acceptable if the gas tube is fixed and the lid moves vertically independently from the gas tube. In such a case, there is an advantage in that the gas ejection position remains the same because a lower end section of the gas tube does not move vertically.

Also, the lid is made of SiC member in each embodiment. More importantly, it is acceptable if the lid is made of a raw material which is non-reactive with other silicon oxide gas or a silicide. Also, the overall lid is made of a SiC in the above embodiment. However, more importantly, it is acceptable if only a bottom surface of the lid is made of a member which is inert to other silicon oxide gas or a silicide. For example, it is acceptable if a bottom surface of the carbon lid is coated by an SiC layer.

What is claimed is:

1. A casting apparatus comprising:
   a die that has an opening section above the die so as to pour a molten metal therefrom;
   a plate-shaped heater disposed above the die horizontally;
   a gas supplying section configured to supply an inert gas to a surface of the molten metal;
   a lid disposed horizontally between the surface of the molten metal and the heater; and
   a lid moving structure configured to rotatably move the lid relative to the die and configured to control an opening amount of the opening section above the die,
   wherein:
   the lid moving structure configured to control a flow rate of an inert gas exhausted from a surface of the molten metal so that the flow rate is determined in accordance with a flow amount of the inert gas supplied from the gas supplying section and the opening amount of the opening section above the die; and
   the flow rate of the inert gas is in a predetermined range.

2. A casting apparatus according to claim 1, wherein the lid moving structure is configured to adjust the opening amount according to a flow amount of the inert gas.

3. A casting apparatus according to claim 1, wherein the lid moving structure has a structure configured to move the lid vertically or horizontally relative to the die.

4. A casting apparatus according to claim 1, wherein:
   the molten metal is a molten silicon; and
   at least a bottom surface of the lid is coated by a non-reactive material with a silicon oxide gas or a silicide.

5. A casting apparatus according to claim 1, wherein the plate-shaped heater is supported in parallel with the lid.

6. A casting apparatus comprising:
   a die that has an opening section above the die so as to pour a molten metal therefrom;
   a plate-shaped heater disposed above the die horizontally;
   a gas supplying section configured to supply an inert gas to a surface of the molten metal;
   a lid disposed horizontally between the surface of the molten metal and the heater; and
   a lid moving structure configured to move the lid relative to the die and configured to control an opening amount of the opening section above the die,
   wherein:
   the lid comprises a first plate having at least a first hole, and an adjacent second plate having a corresponding number of second hole; and
   the first plate is configured to rotate relative to the second plate such that each first hole coincides with each second hole.

7. A casting apparatus according to claim 1, further comprising an additional heater disposed below the die.

8. A casting apparatus comprising:
   a die having an opening section;
   a heater disposed above said die;
   a gas supplying section configured to supply an inert gas to a surface of molten metal provided within said die;
   a lid configured to be disposed between the surface of the molten liquid and said heater; and
   means for adjusting an opening amount of said opening section according to a flow amount of the inert gas to the surface of the molten metal,
   wherein:

the means for adjusting is configured to rotate said lid relative to said die the means for adjusting controls a flow rate of an inert gas exhausted from a surface of the molten metal so that the flow rate is determined in accordance with the flow amount of the inert gas supplied from the gas supplying section and the opening amount of the opening section above the die; and the flow rate of the inert gas is in a predetermined range.

9. The casting apparatus according to claim 8, wherein said means for adjusting adjusts said opening amount of said opening section wherein a flow speed of the inert gas flowing out of the opening section between said lid and said die is constant.

10. The casting apparatus according to claim 9, wherein said means for adjusting increases said opening amount of said opening section when the flow speed of the inert gas flowing out of the opening section between said lid and said die increases, and decreases said opening amount of said opening section when the flow speed of the inert gas flowing out of the opening section between said lid and said die decreases.

11. The casting apparatus according to claim 9, wherein said means for adjusting adjusts said opening amount of said opening section by moving said lid relative to said die.

12. The casting apparatus according to claim 11, wherein said means for adjusting adjusts said opening amount of said opening section by vertically moving said lid relative to said die.

13. The casting apparatus according to claim 11, wherein said means for adjusting adjusts said opening amount of said opening section by horizontally moving said lid relative to said die.

14. The casting apparatus according to claim 11, wherein said means for adjusting adjusts said opening amount of said opening section by rotating said lid relative to said die.

15. A casting apparatus comprising:

a die having an opening section;

a heater disposed above said die;

a gas supplying section configured to supply an inert gas to a surface of molten metal provided within said die;

a lid configured to be disposed between the surface of the molten liquid and said heater; and means for adjusting an opening amount of said opening section according to a flow amount of the inert gas to the surface of the molten metal, wherein:

said lid comprises a first plate having a first hole, and an adjacent second plate having a second hole, and said means for adjusting adjusts said opening amount of said opening section by rotating said first plate relative to said second plate such that said first hole coincides with said second hole.

16. The casting apparatus according to claim 8, further comprising an additional heater disposed below said die.

17. A casting apparatus according to claim 1, wherein the predetermined range of the flow rate of the inert gas is controlled so that impurities are not included in the molten metal and the lid does not move due to the inert gas flow.

* * * * *